United States Patent
Ishiwata et al.

(10) Patent No.: US 7,413,965 B2
(45) Date of Patent: Aug. 19, 2008

(54) METHOD OF MANUFACTURING A THIN-FILM CIRCUIT SUBSTRATE HAVING PENETRATING STRUCTURE, AND PROTECTING ADHESIVE TAPE

(75) Inventors: Shinichi Ishiwata, Tokyo (JP); Masakatsu Inada, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 99 days.

(21) Appl. No.: 11/224,924

(22) Filed: Sep. 14, 2005

(65) Prior Publication Data

US 2006/0115989 A1    Jun. 1, 2006

Related U.S. Application Data

(63) Continuation of application No. PCT/JP2004/005008, filed on Apr. 7, 2004.

(30) Foreign Application Priority Data

May 29, 2003    (JP)    ............................... 2003-153216

(51) Int. Cl.
*H01L 21/00*    (2006.01)
(52) U.S. Cl. ........................... 438/464; 438/33; 438/68; 438/107; 438/103; 257/52; 257/594; 257/618
(58) Field of Classification Search ................. 257/527, 257/594, 618, 662; 438/33, 68, 107, 113, 438/460, 461, 462, 463, 464, 465
See application file for complete search history.

(56) References Cited

U.S. PATENT DOCUMENTS

| 6,656,819 | B1* | 12/2003 | Sugino et al. | ................ | 438/460 |
| 6,756,288 | B1* | 6/2004 | Feil et al. | ..................... | 438/464 |
| 6,805,808 | B2* | 10/2004 | Fujii et al. | ..................... | 216/52 |
| 2003/0054643 | A1* | 3/2003 | Aihara et al. | ................ | 438/689 |
| 2003/0176069 | A1* | 9/2003 | Yuasa et al. | ................. | 438/692 |

FOREIGN PATENT DOCUMENTS

| JP | 7-29860 A | 1/1995 |
| JP | 7-106285 A | 4/1995 |
| JP | 8-20756 A | 1/1996 |
| JP | 8-330257 A | 12/1996 |
| JP | 2000-38556 A | 2/2000 |
| JP | 2000-294522 A | 10/2000 |
| JP | 2000-349136 A | 12/2000 |
| JP | 2001-210701 A | 8/2001 |
| JP | 2002-75942 A | 3/2002 |
| JP | 2002-93752 A | 3/2002 |
| JP | 2002-319554 A | 10/2002 |
| JP | 2003-7648 A | 1/2003 |
| JP | 2003-7649 A | 1/2003 |
| JP | 2003-179005 A | 6/2003 |

* cited by examiner

*Primary Examiner*—W. David Coleman
*Assistant Examiner*—Su C Kim
(74) *Attorney, Agent, or Firm*—Birch, Stewart, Kolasch, and Birch, LLP

(57) ABSTRACT

A method of manufacturing a thin-film circuit substrate, containing:

(a) gouging a surface of a circuit substrate in a depth at least approximately equal to a thickness of a final product of the substrate, to form a section to be formed a penetrating section;

(b) providing a protecting adhesive tape to adhere to the gouged surface of the substrate, before a backing surface of the substrate is ground;

(c) grinding the backing surface in such a thickness that the gouged section would not penetrate;

(d) dry etching entirely the backing surface, while the tape adheres to the substrate, after completion of the grinding for the backing surface; and (e) making the gouged section of the substrate to penetrate, by the dry etching, thereby forming the penetrating structure section; and,
a protecting adhesive tape usable in the method.

12 Claims, No Drawings

METHOD OF MANUFACTURING A THIN-FILM CIRCUIT SUBSTRATE HAVING PENETRATING STRUCTURE, AND PROTECTING ADHESIVE TAPE

This application is a Continuation of copending PCT International Application No. PCT/JP2004/005008 filed on Apr. 7, 2004, which designated the United States, and on which priority is claimed under 35 U.S.C. § 120. This application also claims priority under 35 U.S.C. § 119(a) on Patent Application No(s). 2003-153216 filed in Japan on May 29, 2003. The entire contents of each of the above documents is hereby incorporated by reference.

TECHNICAL FIELD

The present invention relates to a method of manufacturing a thin-film circuit substrate and the like, which has a micro electromechanical systems (which may be referred to as an MEMS, hereinafter) structure section or a structure section penetrating said substrate. The present invention also relates to a protecting adhesive tape usable in the method.

BACKGROUND ART

Hitherto, as a method of forming a penetrating structure section on a circuit substrate, the following method is used. That is, a section to be formed a penetrating structure in a circuit of a circuit substrate which has been thinned to have a thickness equal to the thickness of a final product in advance, is melted and removed by a laser beam or plasma irradiation, to form the penetrating section. The method of manufacturing the circuit having the penetrating section is an extension of a method of manufacturing a semiconductor wafer, and the circuit is formed on a wafer made of silicon and the like.

Examples of applications or usage of the circuit substrate having such a penetrating structure include, for example, various motion sensors each having an MEMS (micro electromechanical system) structure section.

As these circuit substrates, in general, a silicon or compound semiconductor wafer, or a substrate made of various glasses or ceramics, are used. Of these wafers and substrates, a silicon wafer, which is widely used, is manufactured such that a high-purity silicon ingot obtained by a single-crystal pulling method is sliced into wafers each having a thickness of about 500 to 1,000 µm. A penetrating structure is formed in a surface of the silicon wafer manufactured as described above, by the similar manufacturing method as a method of forming a circuit pattern on a semiconductor wafer, thereby to manufacture various motion sensor circuits. Then, to thin the wafer in which the penetrating structure is formed to have a predetermined thickness which is adapted to various applications or which is required for the characteristics of various motion sensors, the backing surface of the wafer is subjected to grinding by a device, which is called a back-side grinder, to obtain a thinned film. Further, if necessary, a stress relief processing typified by chemical etching, CMP (chemical mechanical polishing) or the like, may be performed, to remove grinding distortion such as a crushed layer resulting by grinding.

Thereafter, a section to be formed the penetrating structure in the circuit is processed by partial cutting by a laser beam or plasma irradiation, to form the penetrating structure by penetrating the wafer, thereby manufacturing a circuit substrate. Meanwhile, recently, it is studied that a wafer itself is further thinned, in order to attain improvement in the performance of a motion sensor.

In the meantime, in the conventional method of manufacturing a circuit substrate having an MEMS structure section, when a predetermined wafer thickness at the time the MEMS structure section is formed is so large as 300 µm or more, the wafer itself is not broken by grinding of the wafer, and the wafer itself is high in mechanical strength. Therefore, in handling of the wafer when the MEMS section is formed in the wafer after being subjected to the grinding, the wafer and/or the MEMS structure section is hardly broken or cracked. Accordingly, such a thick circuit substrate can be stably manufactured, without any problem in a yield in manufacture thereof.

On the other hand, in recent years, with increasing use of a semiconductor, such as mounting on a mobile device, a three-dimensional high-density mounting-type package, as typified by a stacking-type CSP (chip size package), has been rapidly and widely spread. According to this, with equalization of a chip area and a package projection area and decreasing to make a package thickness thin, a chip itself to be mounted must be thinned, i.e. the thickness of a semiconductor wafer itself must be extremely decreased to be 25 to 100 µm. Similarly, even in various motion sensors, with further improvement of performance and the like, the circuit substrate is further thinned. In various motion sensors, it is not required at the current state, to extremely thin those, contrary to that in the above semiconductor cases. However, when the predetermined thickness of a circuit substrate such as a wafer is small, i.e. 300 µm or less, or about 100 µm which is frequently examined currently, the following problem occurs. That is, a defect, such as breakage or crack, is apt to be caused by inter-step conveyance or contact between the wafer and a jig or the like, when a penetrating structure section is formed in the wafer after grinding, thereby a yield of products conspicuously decreases.

Further, the following method is also known. That is, while a tape material adheres to a surface of the wafer on which the circuit is formed, the backing surface of the wafer is ground and etched, and then a region corresponding to a semiconductor device is masked, and the wafer is etched from the backing surface side, to separate the wafer into individual semiconductor devices. However, this method is not a method of manufacturing a circuit substrate having a penetrating structure.

DISCLOSURE OF THE INVENTION

The present invention resides in a method of manufacturing a thin-film circuit substrate, which comprises the steps of:

(a) gouging a surface of a circuit substrate in advance in a depth which is at least approximately equal to a thickness of a final product of the circuit substrate, to form a section to be formed therein a penetrating section;

(b) providing a protecting adhesive tape to adhere to the surface of the circuit substrate subjected to the gouging, before a backing surface of the circuit substrate is ground;

(c) grinding the backing surface of the circuit substrate in such a thickness that the section subjected to the gouging in advance would not penetrate through the substrate;

(d) dry etching entirely the backing surface of the circuit substrate, while the protecting adhesive tape adheres to the circuit substrate, after completion of the grinding for the backing surface of the circuit substrate; and (e) making the section subjected to the gouging on the surface of the circuit substrate to penetrate, by the dry etching, thereby forming the penetrating structure section.

Further, the present invention resides in a protecting adhesive tape usable in the manufacturing method, wherein a film-like support constituting the protecting adhesive tape is in sufficient contact with a circuit substrate adsorptive-fixing stage of a dry etching device, to prevent defect from occurring due to shortage of adsorptive power in the dry etching.

Further, the present invention resides in a protecting adhesive tape usable in the manufacturing method, wherein an adsorptive power between a film-like support constituting the protecting adhesive tape and a circuit substrate adsorptive-fixing stage of a dry etching device is at least 1,500 Pa.

Further, the present invention resides in a protecting adhesive tape usable in the manufacturing method, wherein a film-like support constituting the protecting adhesive tape is composed of a thermoplastic resin having a melting point of at least 100° C.

Other and further features and advantages of the invention will appear more fully from the following description.

BEST MODE FOR CARRYING OUT THE INVENTION

According to the present invention, there are provided the following means:

(1) A method of manufacturing a thin-film circuit substrate, comprising the steps of:
   (a) gouging (grooving) a surface of a circuit substrate in advance in a depth which is at least approximately equal to a thickness of a final product of the circuit substrate, to form a section to be formed therein a penetrating section;
   (b) providing a protecting adhesive tape to adhere to the surface of the circuit substrate subjected to the gouging step, before a backing surface of the circuit substrate is ground;
   (c) grinding the backing surface of the circuit substrate in such a thickness that the section subjected to the gouging step in advance would not penetrate through the substrate;
   (d) dry etching entirely the backing surface of the circuit substrate, while the protecting adhesive tape adheres to the circuit substrate, after completion of the grinding step for the backing surface of the circuit substrate; and
   (e) making the section subjected to the gouging step on the surface of the circuit substrate to penetrate, by the dry etching, thereby forming the penetrating structure section.

(2) The method of manufacturing a thin-film circuit substrate described in item (1), wherein the protecting adhesive tape is constituted of a radiolucent (radiotransparent) film-like support and has such heat resistance that the protecting adhesive tape can withstand at least increase in substrate temperature in the dry etching;

(3) The method of manufacturing a thin-film circuit substrate described in item (1) or (2), wherein, in the step of gouging the surface of the circuit substrate, the gouging is performed by a laser beam or plasma irradiation;

(4) The method of manufacturing a thin-film circuit substrate described in any one of items (1) to (3), wherein, in the step of adhering the protecting adhesive tape to the surface of the circuit substrate, the adhering is performed in an atmosphere of a reduced-pressure state at least approximately the same as an atmosphere in the dry etching;

(5) A protecting adhesive tape usable in the method of manufacturing a circuit substrate described in any one of items (1) to (4), wherein the film-like support constituting the protecting adhesive tape is in sufficient contact with a circuit substrate adsorptive-fixing stage of a dry etching device, to prevent defect from occurring due to shortage of adsorptive power in the dry etching;

(6) A protecting adhesive tape usable in the method of manufacturing a circuit substrate described in any one of items (1) to (4), wherein an adsorptive power between the film-like support constituting the protecting adhesive tape and a circuit substrate adsorptive-fixing stage of a dry etching device is at least 1,500 Pa;

(7) A protecting adhesive tape usable in the method of manufacturing a circuit substrate described in any one of items (1) to (4), wherein the film-like support constituting the protecting adhesive tape is composed of a thermoplastic resin having a melting point of at least 100° C.;

(8) The protecting adhesive tape described in any one of items (5) to (7), wherein the film-like support constituting the protecting adhesive tape is formed by using a thermoplastic polyester resin;

(9) The protecting adhesive tape described in any one of items (5) to (7), wherein the film-like support constituting the protecting adhesive tape is formed by using a polyester-series elastomer resin;

(10) The protecting adhesive tape described in any one of items (5) to (7), wherein the film-like support constituting the protecting adhesive tape is formed by using a polyolefin-series resin which may have a branched structure; and

(11) The protecting adhesive tape described in any one of items (5) to (7), wherein the film-like support constituting the protecting adhesive tape is formed by using a cross-linkable film.

Herein, in the present invention, an MEMS structure section is meant to be a structure section that can be used in the MEMS technique.

The present invention will be further described below.

The present inventors studied keenly to overcome the problems in a method of thinning and manufacturing a circuit substrate that has a penetrating structure section in a circuit, according to the conventional method. As a result, the present inventors found the followings. That is, first, a circuit is formed in advance, before grinding a backing surface of a wafer to be applied as a substrate; and a gouging processing is performed in a given shape of an MEMS portion having a structure which would penetrate the wafer in a later step, in a depth at which the wafer is not penetrated but is almost penetrated, i.e. in a depth which is at least approximately equal to the thickness of a final product of the circuit substrate. Then, a protecting adhesive tape is attached and adhered to the circuit surface of the wafer, the backing surface of the wafer is subjected to a grinding processing in a thickness at which the groove in the MEMS portion does not penetrate the wafer, and then the entire area of the backing surface of the wafer is subjected to dry etching, to remove a portion of the substrate wafer in a thickness of unnecessary portion. The present inventors have found that, in the above manner, the groove section penetrates the substrate without generating chips or dusts such as substrate pieces, a desired penetrating structure section is formed on the thinned substrate, and the thin-film substrate can be stably produced. The present invention has been accomplished based on this finding.

Some embodiments of the present invention will be described in detail below.

That is, in the present invention, a protecting adhesive tape having an adsorptive power by which the protecting adhesive tape can be in tight contact with a circuit substrate-adsorptive fixing stage in a plasma etching device chamber, is attached and adhered to a circuit surface of a substrate subjected to a gouging processing, in a depth which is at least approximately equal to or slightly larger than a finally finished thickness of the circuit substrate (in this specification and the claims, such a depth is simply referred to a depth which is at least approximately equal to a finally finished thickness of the circuit substrate) in an MEMS shape having a portion, such as a groove or the like, which corresponds to a portion that would penetrate the substrate in a later step, but which does not penetrate the substrate in this stage; the backing surface of the substrate is subjected to grinding in a predetermined thickness at which the groove section does not penetrate the substrate; and then the substrate is thinned, by dry etching performed by plasma irradiation or the like, thereby to penetrate the portion subjected to the gouging. In this manner, a thinned circuit substrate having a fine penetrating structure section can be easily manufactured.

As a concrete method of the dry etching, plasma etching can be used, which is performed by plasma irradiation. For example, when a silicon wafer is used as a circuit substrate, use can be made of a method of vaporizing and removing a substrate wafer in a thickness corresponding to an unnecessary portion, by reaction caused by a fluorine gas excited by a high-frequency wave, under a reduced pressure.

At this time, when air, which is contained and sealed between a groove section corresponding to a through hole section and the protecting adhesive tape adhered to the circuit surface before the plasma processing, is different from an atmosphere in a device chamber in the plasma processing, for example, when the air has a positive pressure (having a pressure higher than a pressure in the chamber), the air contained in the groove section is blown out immediately before the groove section penetrates the substrate. In this case, a portion around the penetrating structure section is broken, or the substrate itself is broken. Therefore, since the atmosphere in which the protecting adhesive tape is adhered depends on the etching conditions of the plasma etching device according to the substrate to be used, the atmosphere is not limited to a specific atmosphere. The protecting adhesive tape is preferably adhered to the circuit surface in an atmosphere having at least a reduced pressure lower than the atmospheric pressure in the air. More preferably, the protecting adhesive tape is adhered to the circuit substrate surface, in a reduced-pressure state having a pressure which is almost equal to that of the atmosphere in the chamber in the plasma etching of the plasma etching device that can be used in plasma etching of the substrate.

In the plasma etching, as in the grinding, a cooling water cannot be directly used. Therefore, the protecting adhesive tape which can be used in the method of the present invention for manufacturing a semiconductor wafer, has heat resistance such that a film-like support does not substantially cause any defect which deteriorates the protection capability to cause a problem in the process, or a defect which makes it impossible to form an MEMS structure section, even though the tape itself is slightly melted or deformed by at least raising of the substrate temperature in the dry etching.

Further, the protecting adhesive tape uses a film-like support which has such an adsorptive power that the protecting adhesive tape is in tight contact with the substrate without floating from the circuit substrate adsorptive-fixing stage in the dry etching device chamber (which floating means that the substrate is partially separated from the said tape or stage) after the protecting adhesive tape is adhered to the substrate, to obtain a sufficient cooling effect in the device.

A resin constituting the above film-like support preferably has a melting point of 100° C. or higher, more preferably 120° C. or higher. As the adsorptive power to the circuit substrate adsorptive fixing stage of the plasma etching device, for example, when a fixing stage achievable by electrostatic adsorption is used as the adsorptive fixing stage for the circuit substrate, an electrostatic adsorptive power applied a voltage same as in plasma irradiation similarly in plasma irradiation, can be used. Further, in other systems, anti-peeling power (adsorptive power) between the substrate and an adsorptive fixing stage when the circuit substrate is adhesively fixed, can be used. In the present invention, as the adsorptive power, as described above, a power which is so strong that the substrate can be in tight contact with the circuit substrate adsorptive fixing stage, without causing a depth of the circuit substrate in the etching process. The adsorptive power is preferably at least 1,500 Pa, more preferably at least 2,000 Pa. As the material of such a protecting adhesive tape, a material appropriately selected from arbitrary materials can be used. In addition, in order to satisfy physical properties, a material in which heat-resistance performance is improved by chemical cross-linking or electron-beam cross-linking, can also be preferably used. When the film-like support is constituted by at least one layer of resin to achieve surface protecting property or stable thinning and grinding performance of the circuit substrate, any of these resins is preferably used as the material of a constituent layer which is in contact with the adsorptive fixing stage for the circuit substrate in plasma etching.

The thickness of the portion removed by the etching process in the present invention is preferably 1 to 50 μm, more preferably 5 to 20 μm. The thickness changes depending on the MEMS structure section to be formed, and is not particularly limited to these specific values.

The above-mentioned plasma etching itself by the plasma irradiation is known. More specifically, for example, a fluorine gas is excited and ionized by high-frequency RF discharge, to etch the backing surface of the wafer.

As a gouging device and a back-side grinder each of which can be used in the manufacturing method of the present invention, an arbitrary device or grinder can be used. As a plasma etching device, use can be preferably made of a so-called plasma etching device, which is developed to relieve processing strain (stress relief) after a thinning/grinding process for a semiconductor wafer and in which an electrostatic adsorption system and a cooling device are incorporated in an adsorptive fixing stage for a wafer to prevent a wafer temperature from excessively increasing in plasma etching.

As the film-like support in the protecting adhesive tape that can be used in the method of the present invention, a plastic, a rubber, or the like is preferably used, in general. As the film-like support, a radiolucent one is selected when a radiation curing-type resin or adhesive is used as an adhesive, or alternatively a film-like support having high optical transparency is selected, when cured by irradiation of ultraviolet ray. When the film-like support is constituted by at least one layer of a resin, as a constituent layer which is in contact with the adsorptive fixing stage for the substrate in plasma etching, use can be made, for example, of a film of a thermoplastic polyester resin, such as polyethylene terephthalate or polybutylene terephthalate, or a polyester-series elastomer resin, such as a polyester/polyether-type resin or a polyester/polyester-type resin; a film of a polyolefin-series resin, such as polypropylene or poly-4-methylpentene-1 having a branched structure; or a film of a cross-linkable polyolefin-series resin, such as polyethylene, polypropylene, an ethylene/propylene copolymer, polybutene-1, poly-4-methylpentene-1, methylpentene-an ethylene/vinyl acetate copolymer, or an ethylene/acrylic acid copolymer.

Further, when the protecting adhesive tape has a constituent layer other than those of the above resins and films, as a resin that can be used in the additional constituent layer, use can be made, for example, of a homopolymer or copolymer of α-olefin such as an ionomer, polyethylene, polypropylene, an ethylene/propylene copolymer, polybutene-1, poly-4-methylpentene-1, an ethylene/vinyl acetate copolymer, an ethylene/acrylic acid copolymer, or a mixture of these; an engineering plastic, such as polyethylene terephthalate, polycarbonate, or polymethyl methacrylate; a thermoplastic elastomer, such as polyurethane, or a styrene/ethylene/butene—or styrene/ethylene/pentene-series copolymer, or the like. Any material can be arbitrarily selected depending on characteristics required for the film-like support.

These film-like supports can be manufactured in a usual manner using an extrusion method. When a film-like support is obtained by making a layered structure of various resins, the film-like support is manufactured by a coextrusion method, a laminating method, or the like. At this time, as is commonly performed in a method of manufacturing a usual laminated film, an adhesive layer may be provided between the resin layers. The thickness of such a film-like support is preferably 30 to 300 µm, more preferably 50 to 150 µm, from the viewpoint of mechanical strength/elongation characteristics and radiolucency.

As an adhesive applied on the film-like support, any adhesive can be used, without any particular limitation, which does not cause defect such as breakage of the wafer or contamination caused by a residual adhesive on the wafer surface, when the protecting adhesive tape is peeled off from the wafer after being subjected to the thinning/grinding. As the adhesive, a radiation curing—, preferably ultraviolet curing-type adhesive is preferably used, which exhibits a three-dimensional network by radiation curing, preferably ultraviolet curing, to reduce the adhesive power, and which hardly generates any residual substance, such as the adhesive on the surface of the wafer from which the tape is peeled off.

The thickness of the radiation curing-type adhesive layer formed on the film-like support is preferably 10 to 200 µm, more preferably 20 to 100 µm, to attain good adhesion properties to the circuit substrate surface.

As the radiation curing-type adhesive, any adhesive having desired ultraviolet curing properties can be used, without particular limitation. Examples of such an adhesive include an acrylic adhesive, which is composed of a copolymer of 2-ethylhexyl acrylate and n-butyl acrylate, and which contains a (meth)acrylate compound having a ultraviolet-curable carbon-carbon double bond.

Such an acrylic adhesive contains a (meth)acrylic copolymer and a curing agent, as essential components. Examples of the (meth)acrylic copolymer include a copolymer with a functional monomer, or a (meth)acrylic polymer of a (meth) acrylate copolymer, and a polymer including a polymer constitutional unit derived from a (meth)acrylate, and a mixture of these polymers. As the molecular weights of the polymers, large-molecular-weight polymers each having a weight-average molecular weight of about 500,000 to 1,000,000 are generally utilized.

Further, the curing agent is used to regulate an adhesive power and a coagulation power, by causing the curing agent to react with functional groups that the (meth)acrylic copolymer have. Examples of the curing agent include an epoxy compound having at least two epoxy groups in the molecule, e.g. 1,3-bis(N,N-diglycidylaminomethyl)cyclohexane, 1,3-bis (N,N-diglycidylaminomethyl)toluene, 1,3-bis(N,N-diglycidylaminomethyl)benzene, N,N,N',N'-tetraglycidyl-m-xylenediamine; an isocyanate-series compound having at least two isocyanate groups in the molecule, e.g. 2,4-tolylenediisocyanate, 2,6-tolylenediisocyanate, 1,3-xylilenediisocyanate, 1,4-xylenediisocyanate, diphenylmethane-4,4'-diisocyanate; an aziridine-series compound having at least two aziridinyl groups in the molecule, e.g. tetramethylol-tri-β-aziridinyl propionate, trimethylol-tri-β-aziridinyl propionate, trimethylolpropane-tri-β-aziridinyl propionate, trimethylolpropane-tri-β-(2-methylaziridine) propionate. The amount of the curing agent to be added may be regulated depending on a desired adhesive power, and it is preferably 0.1 to 0.5 mass parts, to 100 mass parts of the (meth)acrylic copolymer.

Further, as the above-mentioned radiation polymerizable compound, use can be made, for example, of a wide variety of low-molecular-weight compounds each having at least two photopolymerizable carbon-carbon double bonds in the molecule, which can exhibit a three-dimensional network by irradiation of light. More specifically, use can be made widely of, for example, trimethylolpropane triacrylate, tetramethylolmethane tetraacrylate, pentaerythritol triacrylate, pentaerythritol tetraacrylate, dipentaerythritolmonohydroxy pentaacrylate, dipentaerythritol hexaacrylate, 1,4-butyleneglycol diacrylate, 1,6-hexanediole diacrylate, polyethylenegrycol diacrylate, and an origoester acrylate.

As well as the above acrylate-series compounds, an urethane acrylate-series oligomer can also be used. The urethane acrylate-series oligomer can be obtained, by reacting a terminal isocyanate urethaneprepolymer that can be obtained by reaction of a polyol compound such as a polyester-type or polyether-type and a polyisocyanate compound (for example, 2,4-tolylenediisocyanate, 2,6-tolylenediisocyanate, 1,3-xylilenediisocyanate, 1,4-xylilenediisocyanate, diphenylmethane4,4-diisocyanate), with a methacrylate or acrylate having a hydroxyl group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate).

As a mixing ratio of the acrylic adhesive and the radiation polymerizable compound in the radiation curing-type adhesive, the radiation polymerizable compound is mixed in an amount in the range of preferably 50 to 200 mass parts, more preferably 50 to 150 mass parts, to 100 mass parts of the acrylic adhesive.

When the mixing ratio falls within the above range, the adhesive power of the adhesive layer considerably reduces after irradiation of radiation.

Furthermore, as the radiation curing-type adhesive, in place of mixing the radiation polymerizable compound with the acrylic adhesive as mentioned in the above, a radiation-polymerizable acrylate copolymer as the acrylic adhesive itself can also be used.

Further, when the adhesive agent layer is polymerized with a radiation, a photopolymerization initiator, for example, isopropylbenzoinether, isobutylbenzoinether, benzophenone, Michler's ketone, chlorothioxanthone, benzyl methyl ketal, α-hydroxycyclohexyl phenyl ketone, 2-hydroxymethylphenylpropane, or the like, can be additionally used. By adding at least one of these initiators to the adhesive layer, polymerization reaction can be efficiently proceeded.

Further, in addition to the photopolymerization initiator, a photosensitizer, as well as an arbitrary tackifier, a softener, an antioxidant, and the like can be mixed with the radiation curing-type adhesive.

The method of the present invention for thinning and manufacturing a circuit substrate can be applied, for example, to various motion sensors each obtained by forming a structure section having a substrate through hole (penetrating hole) in a circuit. A thinning/grinding process for the circuit substrate, comprises, for example, the following steps of:

(a) gouging a surface of the circuit substrate in advance, in a shape corresponding to a penetrating hole section to be formed in the circuit, in a depth which is at least approximately equal to a thickness of a final product of the circuit substrate;

(b) providing a protecting adhesive tape to adhere to the surface of the circuit substrate subjected to the gouging step, before grinding a backing surface of the circuit substrate;

(c) grinding the backing surface of the circuit substrate in such a thickness that a section subjected to the gouging step in advance would not penetrate;

(d) subjecting the entire area of the backing surface of the circuit substrate to plasma etching, while the protecting adhesive tape adheres to the surface of the circuit substrate after completion of the grinding step for the backing surface of the circuit substrate; and (e) penetrating the section subjected to the gouging step on the surface of the circuit substrate, by the plasma etching, to thereby form the penetrating structure.

The method of the present invention for manufacturing a thin-film circuit substrate having a penetrating structure, is remarkably effective, in particular, in formation of a fine MEMS structure section which has a shape such as a groove penetrating a substrate in a circuit substrate which can be applied to various motion sensors or the like. The manufacturing method of the present invention exhibits excellent advantageous effects that the penetrating structure section can be stably and efficiently formed and that a further thinned circuit substrate can be manufactured.

Further, according to the protecting adhesive tape of the present invention, a film-like support has heat resistance to plasma etching, and a preferable adhesion properties to the adsorptive fixing stage for the circuit substrate can be obtained. The protecting adhesive tape of the present invention is preferably used in the above method of manufacturing a thin-film circuit substrate having a penetrating structure section.

EXAMPLES

The present invention will be described in more detail based on examples given below, but the invention is not meant to be limited by these.

Example 1

On a film of polybutylene terephthalate (NOVADURAN 5510S (trade name), manufactured by Mitsubishi Engineering Plastics Corporation, melting point: 216° C.) having a thickness of 100 μm and serving as a film support, an ultraviolet curable adhesive (obtained by mixing 100 mass parts of an acrylic adhesive composed of a copolymer of 2-ethylhexyl acrylate and n-butyl acrylate, with 80 mass parts of dipentaerythritol hexaacrylate, and 1 mass part of α-hydroxy-cyclohexyl phenyl ketone as a photopolymerization initiator) was coated to form an adhesive agent layer of a thickness 30 μm, thereby to prepare a protecting adhesive tape.

The thus-obtained protecting adhesive tape was attached and adhered onto a surface of a circuit substrate with a diameter of 6 inches (15.24 cm) and a thickness of about 600 μm, on which surface a circuit was formed and was gouged (grooved) in a through-hole shape in a depth of 105 μm, in an atmosphere reduced by 80 kPa than the atmospheric pressure of the air, using a full automatic attaching/adhering device (TEAM100 (trade name), manufactured by Takatori Corporation) which can attach and adhere a protecting adhesive tape to a substrate in a reduced pressure. Then, the backing surface of the circuit substrate was subjected to grinding, which is called backgrinding (BG), by using a back-side grinder (DFG850 (trade name), manufactured by DISCO Corporation), to shape the circuit substrate into a thickness of 110 μm.

Then, while the protecting adhesive tape was attached to the circuit substrate, the circuit substrate was subjected to etching with a fluorine-series gas from the backing surface side, by using a plasma etching device, to further remove the substrate by 10 μm. Thus, the circuit substrate was shaped into a predetermined thickness of 100 μm, and at the same time, an MEMS structure section in which the gauged groove section penetrated was formed. The thus-obtained penetrated substrate was observed whether the protecting adhesive tape was deteriorated or not, to evaluate heat resistance of the said tape. Further, after an ultraviolet ray was irradiated on the attached protecting adhesive tape at 500 mJ/cm², by using a conventional protecting tape peeling device (HR8500II (trade name), manufactured by NITTO DENKO CORPORATION), the protecting adhesive tape was peeled from the thinned circuit substrate. The thus-obtained substrate from which the protecting tape was peeled off was observed, with respect to easiness of peeling as peeling properties and whether the thin-film circuit substrate and the MEMS structure section were suffered breakage or the like. Furthermore, as adsorptivity of the film-like support, an adsorptive power between the circuit substrate and the adsorptive stage was measured by a load cell. The measurement was made on the circuit substrate to which the protective adhesive tape was attached and which the said tape was adsorptively fixed to the adsorptive stage of the plasma etching device as in irradiation of plasma etching, but in the state no plasma was irradiated. The obtained results are shown in Table 1 described below.

Example 2

On a film of a polyester-series elastomer (Hytrel G4704 (trade name), manufactured by Toray-DuPont Co., Ltd., melting point: 170° C.) having a thickness of 100 μm and serving as a film support, an ultraviolet curing-type resin layer (obtained by mixing 100 mass parts of an acrylic adhesive composed of a copolymer of 2-ethylhexyl acrylate and n-butyl acrylate, with 80 mass parts of dipentaerythritol hexaacrylate, and 1 mass part of α-hydroxy-cyclohexyl phenyl ketone as a photopolymerization initiator) having a thickness of 30 μm, which was the same as in Example 1, was coated, to prepare a protecting adhesive tape.

After the thus-obtained protecting adhesive tape was attached and adhered onto a surface of a circuit substrate and then processed in the same manner as in Example 1, an ultraviolet ray was irradiated on the surface of the protecting tape at 500 mJ/cm². Further, in the same manner as in Example 1, except for the protecting adhesive tape to be used, tests were carried out with respect to the deterioration state in the outer appearance, as the heat resistance of the protecting adhesive tape, such as melting of the protecting adhesive tape by the plasma etching after the grinding; the peeling properties of the protecting adhesive tape; the breakage state of the penetrating structure section after the protecting adhesive tape was peeled; and the adsorptivity of the film-like support. The obtained results are shown in Table 1 described below.

Example 3

On a film of poly-4-methylpentene-1 (TPX, MX002 (trade name), manufactured by Mitsui Chemicals Inc., melting point: 235° C.) having a thickness of 100 μm and serving as a film-like substrate, an acrylic adhesive composed of a copolymer of 2-ethylhexyl acrylate and n-butyl acrylate was coated to form an adhesive layer of a thickness 30 μm, thereby to prepare a protecting adhesive tape.

The thus-obtained protecting adhesive tape was attached and adhered onto a circuit substrate and then processed in the same manner as in Example 1. Then, in the same manner as in Example 1, except that ultraviolet irradiation was not performed in peeling of the protecting adhesive tape, tests were carried out with respect to the deterioration state in the outer appearance, as the heat resistance of the protecting adhesive tape, such as melting of the protecting adhesive tape by the plasma etching after the grinding; the peeling properties of the protecting adhesive tape; the breakage state of the penetrating structure section after the protecting adhesive tape was peeled; and the adsorptivity of the film-like support. The obtained results are shown in Table 1 described below.

Comparative Example 1

A protecting adhesive tape was prepared in the same manner as in Example 1, except that an ethylene/vinyl acetate copolymer (Ultrasen 627 (trade name), manufactured by Tosoh Corporation: vinyl acetate content 20 mass % and melting point 85° C.) was used as the film-like support of the protecting adhesive tape. Then, in the same manner as in Example 1, tests were carried out with respect to the deterioration state in the outer appearance, as the heat resistance of the protecting adhesive tape, such as melting of the protecting adhesive tape by the plasma etching after the grinding; the peeling properties of the protecting adhesive tape; the breakage state of the penetrating structure section after the protecting adhesive tape was peeled; and the adsorptivity of the film-like support. The obtained results are shown in Table 1 described below.

Comparative Example 2

In the same manner as in Example 1, the protecting adhesive tape was attached and adhered onto a surface of a circuit substrate with a diameter of 6 inches (15.24 cm) as in Example 1, on which surface a circuit was formed and was gouged in a through-hole shape of the MEMS structure section in a depth of 105 μm, in an atmosphere reduced by 80 kPa than the atmospheric pressure in the air, using a full automatic attaching/adhering device (TEAM100 (trade name), manufactured by Takatori Corporation) which can attach and adhere a protecting adhesive tape to a substrate in a reduced pressure. Then, the backing surface of the circuit substrate was subjected to grinding, by using a back-side grinder (DFG850 (trade name), manufactured by DISCO Corporation), to shape the circuit substrate into a thickness of 110 μm.

Then, while the protecting adhesive tape was attached to the circuit substrate, the circuit substrate was subjected to grinding from the backing surface side, by using a CMP (chemical mechanical polishing) device, to further remove the substrate by 10 μm. Thus, the circuit substrate was shaped into a predetermined thickness of 100 μm, and at the same time, the MEMS structure section in which the gauged groove section penetrated was formed. Then, in the same manner as in Example 1, tests were carried out with respect to the deterioration state in the outer appearance, as the heat resistance of the protecting adhesive tape, such as melting of the protecting adhesive tape after the grinding to form the penetrating hole; the peeling properties of the protecting adhesive tape; the breakage state of the penetrating structure section after the protecting adhesive tape was peeled; and the adsorptivity of the film-like support. The obtained results are shown in Table 1 described below.

Comparative Example 3

A protecting adhesive tape was prepared in the same manner as in Example 1, except that a high-density polyethylene (Nipolon Hard 6200 (trade name), manufactured by Tosoh Corporation, melting point: 135° C.) was used as the film-like support of the protecting adhesive tape. Then, in the same manner as in Example 1, tests were carried out with respect to the deterioration state in the outer appearance, as the heat resistance of the protecting adhesive tape, such as melting of the protecting adhesive tape by the plasma etching after the grinding; the peeling properties of the protecting adhesive tape; the breakage state of the MEMS (penetrating) structure section after the protecting adhesive tape was peeled; and the adsorptivity of the film-like support. The obtained results are shown in Table 1 described below.

Comparative Example 4

In the same manner as in Example 1, the protecting adhesive tape was attached and adhered, in the air, onto a surface of a circuit substrate with a diameter of 6 inches (15.24 cm) as in Example 1, on which surface a circuit was formed and was gouged in a through-hole shape of the penetrating structure section in a depth of 105 μm, using a conventional protecting adhesive tape attaching device (DR8500II (trade name), manufactured by NITTO DENKO CORPORATION). Then, the backing surface of the circuit substrate was subjected to grinding, by using a back-side grinder (DFG850 (trade name), manufactured by DISCO Corporation), to shape the circuit substrate into a thickness of 110 μm. Then, in the same manner as in Example 1, tests were carried out with respect to the deterioration state in the outer appearance, as the heat resistance of the protecting adhesive tape, such as melting of the protecting adhesive tape by the plasma etching after the grinding; the peeling properties of the protecting adhesive tape; the breakage state of the penetrating structure section and the periphery thereof after the protecting adhesive tape was peeled; and the adsorptivity of the film-like support. The obtained results are shown in Table 1 described below.

Here, criteria for evaluation of the tests are as follows.
(1) Heat resistance of protecting adhesive tapes
  ○: Deterioration such as melting of the film-like support in outer appearance is not observed.
  ×: Melting of the film-like support in outer appearance is observed, or the film-like support is fused and bonded on the adsorptive fixing stage for substrate and the substrate cannot be conveyed to the next step.
(2) Adsorptivity of film-like supports [1]
  ○: An adsorptive power between the circuit substrate and the circuit substrate adsorptive fixing stage is 1,500 Pa or more.
  ×: An adsorptive power between the circuit substrate and the circuit substrate adsorptive fixing stage is less than 1,500 Pa.
(3) Adsorptivity of film-like supports [2]
  ○: A defect such as floating of the circuit substrate upon plasma etching does not occur.
  ×: Floating of the circuit substrate upon plasma etching occurs.
(4) Formability of penetrating structure section
  ○: No defect, such as breakage or microcrack, is observed by microscopic observation.
  ×: Defect, such as breakage or microcrack, is observed by microscopic observation.
(5) Peeling properties of protecting adhesive tapes
  ○: The protecting adhesive tape can be easily peeled off, without causing breakage and microcrack of the wafer.
  ×: Breakage or microcrack of the wafer occurs, or the protecting adhesive tape cannot be peeled off.

TABLE 1

|  | Example 1 | Example 2 | Example 3 | Comparative Example 1 | Comparative Example 2 | Comparative Example 3 | Comparative Example 4 |
|---|---|---|---|---|---|---|---|
| Film support | Polybutylene terephthalate | Polyester-series elastomer | Polymethyl-pentene | Ethylene/vinyl acetate copolymer | As in Example 1 | High-density polyethylene | As in Example 1 |
| Melting point (° C.) | 216 | 170 | 235 | 85 | 216 | 135 | 216 |
| Adhesive | UV curing resin | UV curing resin | Pressure-sensitive (non-UV curing) type | As in Example 1 | As in Example 1 | As in Example 1 | As in Example 1 |
| Pressure reduced in adhering protecting adhesive tape (kPa) | 80 | 80 | 80 | As in Example 1 | As in Example 1 | As in Example 1 | Pressure in the air |
| UV irradiation | UV irradiation | UV irradiation | No UV irradiation | As in Example 1 | As in Example 1 | As in Example 1 | As in Example 1 |
| Finishing process after backgrinding | Plasma etching | Plasma etching | Plasma etching | As in Example 1 | CMP | As in Example 1 | As in Example 1 |
| (1) Heat resistance of protecting adhesive tape | ○ | ○ | ○ | x | ○ | ○ | ○ |
| (2) Adsorptivity of film-like support [1] (adsorptive power: Pa) | ○ (1750) | ○ (2500) | ○ (1600) | ○ (2900) | ○ (1750) | x (1270) | ○ (1750) |
| (3) Adsorptivity of film-like support [2] (occurrence state of floating of circuit substrate) | ○ | ○ | ○ | ○ | ○ | x | ○ |
| (4) Formability of penetrating structure section | ○ | ○ | ○ | x | x | x | x |
| (5) Peeling properties of protecting adhesive tape | ○ | ○ | ○ | x | ○ | x | ○ |

As is apparent from the results in Table 1, in Comparative Example 1, after the plasma etching, the circuit substrate could not be peeled from the circuit substrate adsorptive fixing stage, thereby the circuit substrate could not be conveyed to the protecting adhesive tape peeling device in the next step.

Further, in Comparative Example 2, in the formation of the penetrating structure section by grinding from the backing surface side of the circuit substrate by CMP, when the gouged groove section penetrated, swarf or dust formed upon grinding and pieces of broken substrate at the grooved section were accumulated in the fine penetrating structure section. Then, as the circuit substrate repetitively moved, the periphery of the penetrating structure section was cracked. In Comparative Example 3, the adsorptive power to the circuit substrate adsorptive fixing state was not sufficient, a sufficient cooling effect could not be achieved, and degradation of the film-like support was observed. In Comparative Example 4, in the formation of the penetrating structure section, trapped or confined air was explosively blown out at the moment when the groove section had penetrated, which caused cracks around the penetrating structure section and breakage of the wafer.

Contrary to the above, in Examples 1 to 3 according to the method of the present invention, all of the heat resistance of the protecting adhesive tape, the peeling properties of the protecting adhesive tape, the formability of the MEMS structure section, and the adsorptivity of the film-like support were preferably excellent. Thus, the present invention can attain to efficiently manufacture a thinned film-like circuit substrate having an MEMS structure section.

INDUSTRIAL APPLICABILITY

The method of the present invention overcomes the problems in the conventional method for thinning down a product, in manufacturing of a circuit substrate having a penetrating structure section. Further, the method of the present invention is preferably used as a method of stably forming an MEMS structure section, and a method of stably manufacturing various motion sensors.

Further, the protecting adhesive tape of the present invention is preferably used when a circuit substrate is manufactured by the above manufacturing method.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A method of manufacturing a thin-film circuit substrate, comprising the steps of:
   (a) gouging a surface of a circuit substrate in advance in a depth which is at least approximately equal to or slightly larger than a finally finished thickness of the circuit substrate, without penetrating the substrate, to form a section to be formed therein a penetrating section;
   (b) providing a protecting adhesive tape to adhere to the surface of the circuit substrate subject to the gouging step, before a backing surface of the circuit substrate is ground;
   (c) grinding the backing surface of the circuit substrate in such a thickness that the section subjected to the gouging step in advanced would not penetrate through the substrate;
   (d) dry etching entirely the backing surface of the circuit substrate, while the protecting adhesive tape adheres to the circuit substrate, after completion of the grinding step for the backing surface of the circuit substrate; and (e) making the section subjected to the gouging step on the surface of the circuit substrate to penetrate, by the dry etching, thereby forming the penetrating structure section, wherein the protecting adhesive tape is constituted of a radiolucent film-like support and has such heat resistance that the withstands can withstand at least increase in substrate temperature in the dry etching, wherein, in the step of gouging the surface of the circuit substrate, the gouging is performed by a laser beam or plasma irradiation, and wherein, in the step of adhering the protecting adhesive tape to the surface of the circuit substrate, the adhering is performed in an atmosphere having at least a reduced pressure lower than the atmospheric pressure in the air or in an atmosphere of a reduced-pressure state at least approximately the same as an atmosphere in the dry etching.

2. A protecting adhesive tape usable in the method according to claim 1, wherein the film-like support constituting the protecting adhesive tape is in sufficient contact with a circuit substrate adsorptive-fixing stage of a dry etching device, to prevent defect from occurring due to shortage of adsorptive power in the dry etching.

3. A protecting adhesive tape usable in the method according to claim 1, wherein an adsorptive power between the film-like support constituting the protecting adhesive tape and a circuit substrate adsorptive-fixing stage of a dry etching device is at least 1,500 Pa.

4. A protecting adhesive tape usable in the method according to claim 1, wherein the film-like support constituting the protecting adhesive tape is composed of a thermoplastic resin having a melting point of at least 100° C.

5. The protecting adhesive tape according to claim 2, 3, or 4, wherein the film-like support constituting the protecting adhesive tape is formed by using a thermoplastic polyester resin.

6. The protecting adhesive tape according to claim 2, 3, or 4, wherein the film-like support constituting the protecting adhesive tape is formed by using a polyester-series elastomer resin.

7. The protecting adhesive tape according to claim 2, 3, or 4, wherein the film-like support constituting the protecting adhesive tape is formed by using a polyolefin-series resin optionally having a branched structure.

8. The protecting adhesive tape according claim 2, 3, or 4, the film-like support constituting the protecting adhesive tape is formed by using a cross-linkable film.

9. A method of manufacturing a thin-film circuit substrate having a microelectromechanical system ("MEMS") structure section, comprising the steps of:

(a) gouging a surface of a circuit substrate in advance in a depth which is at least approximately equal to or slightly larger than a finally finished thickness of the circuit substrate, without penetrating the substrate, to form a section to be formed therein a penetrating section;

(b) providing a protecting adhesive tape to adhere to the surface of the circuit substrate subject to the gouging step, before a backing surface of the circuit substrate is ground;

(e) grinding the backing surface of the circuit substrate in such a thickness that the section subjected to the gouging step in advanced would not penetrate through the substrate;

(d) dry etching entirely the backing surface of the circuit substrate, while the protecting adhesive tape adheres to the circuit substrate, after completion of the grinding step for the backing surface of the circuit substrate; and (e) making the section subjected to the gouging step on the surface of the circuit substrate to penetrate, by the dry etching, thereby forming the MEMS structure section, wherein the protecting adhesive tape is constituted of a radiolucent film-like support and has such heat resistance that the withstands can withstand at least increase in substrate temperature in the dry etching, wherein, in the step of gouging the surface of the circuit substrate, the gouging is performed by a laser beam or plasma irradiation, and wherein, in the step of adhering the protecting adhesive tape to the surface of the circuit substrate, the adhering is performed in an atmosphere having at least a reduced pressure lower than the atmospheric pressure in the air or in an atmosphere of a reduced-pressure state at least approximately the same as an atmosphere in the dry etching.

10. The method according to claim 9, wherein the thickness of the thin-film circuit substrate having a MEMS structure section is from 25 to 300 µm.

11. A method of preventing a thin-film circuit substrate breakage or mieroerack, comprising the steps of:

(a) gouging a surface of a circuit substrate in advance in a depth which is at least approximately equal to or slightly larger than a finally finished thickness of the circuit substrate, without penetrating the substrate, to form a section to be formed therein a penetrating section;

(b) providing a protecting adhesive tape to adhere to the surface of the circuit substrate subject to the gouging step, before a backing surface of the circuit substrate is ground;

(c) grinding the backing surface of the circuit substrate in such a thickness that the section subjected to the gouging step in advanced would not penetrate through the substrate;

(d) dry etching entirely the backing surface of the circuit substrate, while the protecting adhesive tape adheres to the circuit substrate, after completion of the grinding step for the backing surface of the circuit substrate; and (e) making the section subjected to the gouging step on the surface of the circuit substrate to penetrate, by the dry etching, thereby forming the penetrating structure section, wherein the protecting adhesive tape is constituted of a radiolucent film-like support and has such heat resistance that the withstands can withstand at least increase in substrate temperature in the dry etching, wherein, in the step of gouging the surface of the circuit substrate, the gouging is performed by a laser beam or plasma irradiation, and wherein, in the step of adhering the protecting adhesive tape to the surface of the circuit substrate, the adhering is performed in an atmosphere having at least a reduced pressure lower than the atmospheric pressure in the air or in an atmosphere of a reduced-pressure state at least approximately the same as an atmosphere in the dry etching.

12. A method of preventing a thin-film circuit substrate having a MEMS structure section from breakage or micro crack, comprising the steps of:

(a) gouging a surface of a circuit substrate in advance in a depth which is at least approximately equal to or slightly larger than a finally finished thickness of the circuit substrate, without penetrating the substrate, to form a section to be formed therein a penetrating section;

(b) providing a protecting adhesive tape to adhere to the surface of the circuit substrate subject to the gouging step, before a backing surface of the circuit substrate is ground;

(c) grinding the backing surface of the circuit substrate in such a thickness that the section subjected to the gouging step in advanced would not penetrate through the substrate;

(d) dry etching entirely the backing surface of the circuit substrate, while the protecting adhesive tape adheres to the circuit substrate, after completion of the grinding step for the backing surface of the circuit substrate; and (e) making the section subjected to the gouging step on the surface of the circuit substrate to penetrate, by the dry etching, thereby forming the penetrating structure section, wherein the protecting adhesive tape is constituted of a radiolucent film-like support and has such heat resistance that the withstands can withstand at least increase in substrate temperature in the dry etching, wherein, in the step of gouging the surface of the circuit substrate, the gouging is performed by a laser beam or plasma irradiation, and wherein, in the step of adhering the protecting adhesive tape to the surface of the circuit substrate, the adhering is performed in an atmosphere having at least a reduced pressure lower than the atmospheric pressure in the air or in an atmosphere of a reduced-pressure state at least approximately the same as an atmosphere in the dry etching.

* * * * *